US006697257B1

(12) United States Patent
Wolf et al.

(10) Patent No.: US 6,697,257 B1
(45) Date of Patent: Feb. 24, 2004

(54) POWER SEMICONDUCTOR MODULE

(75) Inventors: Kuno Wolf, Jungingen (DE); Gerhard Koelle, Wiernsheim (DE); Juergen Zaremba, Rottenburg (DE); Wolfgang Jacob, Horb (DE); Alexander Wallrauch, Gomeringen (DE); Christoph Ruf, Eningen (DE); Ralf Schmid, Kaltental (DE); Peter Urbach, Reutlingen (DE); Bernd Bireckoven, Buehl (DE); Hans-Reiner Krauss, Reutlingen (DE); Dirk Scholz, Brackenheim (DE)

(73) Assignee: Robert Bosch GmbH, Stuttgart (DE)

( * ) Notice: Subject to any disclaimer, the term of this patent is extended or adjusted under 35 U.S.C. 154(b) by 76 days.

(21) Appl. No.: 09/857,802

(22) PCT Filed: Oct. 7, 2000

(86) PCT No.: PCT/DE00/03529

§ 371 (c)(1),
(2), (4) Date: Apr. 9, 2002

(87) PCT Pub. No.: WO01/27997

PCT Pub. Date: Apr. 19, 2001

(30) Foreign Application Priority Data

Oct. 9, 1999 (DE) ........................................ 199 50 026

(51) Int. Cl.$^7$ ................................................ H05K 7/20

(52) U.S. Cl. .................... 361/708; 174/252; 174/686; 257/693; 257/691; 257/719; 361/704; 361/715; 361/719; 361/721; 361/690; 361/736

(58) Field of Search .......................... 165/80.2, 80.3, 165/185; 174/16.3, 252, 259, 260, 262, 263, 265; 257/706–707, 712–713, 691, 693, 683, 686–697, 729, 777, 796, 718–719, 726–727; 361/690, 688, 704–721, 790–794, 736, 783

(56) References Cited

U.S. PATENT DOCUMENTS

| 3,266,125 | A | | 8/1966 | Tobolski | |
|---|---|---|---|---|---|
| 3,388,302 | A | | 6/1968 | McManus | |
| 4,218,694 | A | | 8/1980 | Grzybowski | |
| 4,965,710 | A | * | 10/1990 | Pelly et al. | ................ 361/707 |
| 5,229,917 | A | * | 7/1993 | Harris et al. | ................ 361/707 |
| 5,444,297 | A | * | 8/1995 | Oshima et al. | ............. 257/777 |

(List continued on next page.)

FOREIGN PATENT DOCUMENTS

| DE | 14 39 060 A | 11/1968 |
|---|---|---|
| DE | 33 22 593 A | 1/1985 |
| DE | 39 24 823 A | 2/1991 |
| EP | 0 244 767 A | 11/1987 |
| FR | 927 494 A | 11/1947 |
| FR | 2 525 392 A | 10/1983 |
| JP | 10056131 | * 2/1998 |
| WO | WO 98/15005 | 9/1997 |

Primary Examiner—Gregory Thompson
(74) Attorney, Agent, or Firm—Ronald E. Greigg

(57) ABSTRACT

Disclosed in a power semiconductor module which includes a stack of carrier substrates, disposed one above the other in multiple layers and provided with at least one conductor track on at least one main surface, in which at least one electronic semiconductor component is disposed between two adjacent carrier substrates of the stack and is contacted electrically and heat-conductively to at least one conductor track of a carrier substrate disposed in the stack above the semiconductor component and to at least one further conductor track of a carrier substrate disposed in the stack below the semiconductor component. To both improve heat output and provide a compact design, the two outer carrier substrates of the stack are embodied as one upper and one lower housing wall of a closed housing part surrounding the at least one semiconductor component, and the interstices between the stacked carrier substrates are tightly closed by an encompassing wall secured to the carrier substrates.

29 Claims, 4 Drawing Sheets

U.S. PATENT DOCUMENTS 5,657,203 A * 8/1997 Hirao et al. ................. 361/707
5,786,986 A * 7/1998 Bregman et al. ........... 361/719
5,986,887 A * 11/1999 Smith et al. ................. 361/704
6,014,313 A * 1/2000 Hesselbom ................. 361/704
6,324,072 B1  11/2001 Lorenz et al.

* cited by examiner

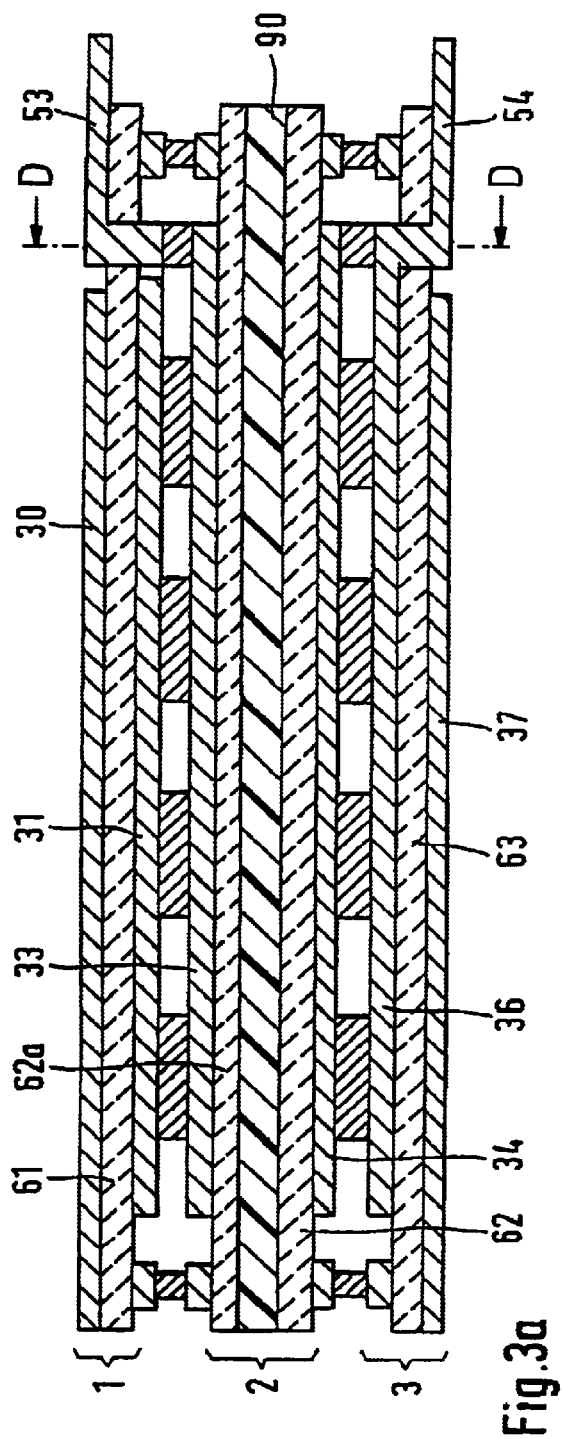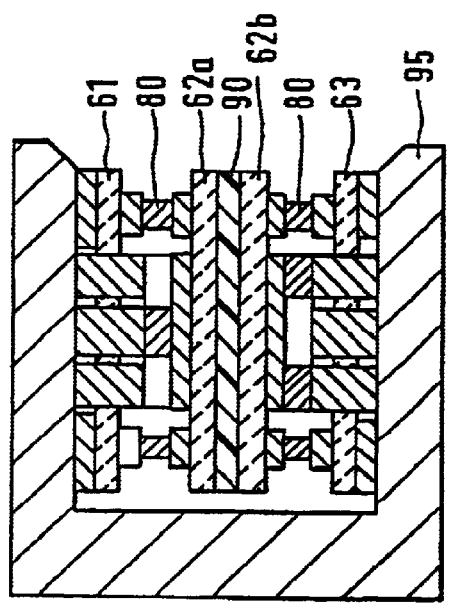
Fig.3a
Fig.3b

POWER SEMICONDUCTOR MODULE

CROSS-REFERENCE TO RELATED APPLICATIONS

This application is a 35 USC 371 application of PCT/DE 00/03529 filed on Oct. 7, 2000.

BACKGROUND OF THE INVENTION

1. Field of the Invention

2. Description of the Prior Art

One power semiconductor module of the type with which this invention is concerned has been disclosed in International Patent Application WO 98/15005, for instance, and has a plurality of semiconductor components which are electrically connected on the top side to a conductor track plane of a first carrier substrate and on the bottom side to a conductor track plane of a second carrier substrate. The stack formed of the two carrier substrates and the semiconductor components disposed between them can be enlarged by stacking further carrier substrates one above the other, with one layer of semiconductor components provided between each two carrier substrates. To improve the heat dissipation, a metal plate that acts as a heat sink is disposed on at least one of the two outer carrier substrates.

To protect the electronic circuit from moisture and dirt, the arrangement comprising the stack and the heat sink must be inserted into a hermetically sealed housing part. A disadvantage of this is that the heat first flows away to the heat sink and only then can it reach the outside through a housing wall. If the heat sink is at the same time a housing wall, for instance in the form of a metal housing bottom, then hermetically sealing off the housing presents major problems. Since the heat sink must be quiet large to achieve efficient cooling, an overall inconveniently large structure has to be hermetically encapsulated, and the design of the housing depends on the size of the heat sink or cooling body used. The heat sink in the encapsulated housing can no longer be altered afterward, so that flexible adaptation of the cooling body to the type and number of heat-generating semiconductor components is impossible.

A further difficulty is that because of the major heat production of power semiconductors, the power semiconductor module must in many cases be cooled with a coolant fluid. In the known arrangements, cooling conduits through which a coolant fluid flows must be made in a complicated way in the cooling body. Since the cooling conduits are embodied on the cooling body located in the housing interior, considerable effort is required to enable delivering the coolant into the hermetically sealed housing and removing it again.

ADVANTAGES AND SUMMARY OF THE INVENTION

The foregoing and other disadvantages are overcome in the power semiconductor module of the invention in which the topmost and bottommost carrier substrate of the stack at the same time forms an upper and lower housing wall of the power semiconductor module, respectively, and the heat generated by the semiconductor components is dissipated to the outer carrier substrates, it is attained that the heat from the outer carrier substrates can be radiated directly to the exterior surrounding the housing part and is not dissipated inside the housing part to a cooling body. The housing part advantageously includes not only the upper and lower housing walls formed of the outer carrier substrates but also an encompassing wall forming the four side walls of the housing part, the encompassing wall being secured to the carrier substrates. It is thus simple to achieve a hermetically sealed and extremely compact design that furthermore enables very efficient heat dissipation to the surroundings of the housing. It is especially advantageous that without any complicated shaping of cooling conduits and without modifying the housing structure, the power semiconductor module of the invention can be inserted into a bathing coolant medium or can be contacted to a cooling body. Advantageously, the heat dissipated to the outer carrier substrates is radiated directly to the respective preferred heat sink. Because of the manifold, flexible usage possibilities, the power semiconductor module of the invention offers considerable advantages over the versions known from the prior art.

Because the electrically contacting of the semiconductor components to the respective carrier substrate disposed above the semiconductor component and to respective carrier substrates disposed below the semiconductor component is brought about by soldering, especially rapid dissipation of the heat in the stack to the outer carrier substrates is made possible.

The heat dissipation can be improved still further in that the interstices between the stacked carrier substrates are completely filled by a flowable, curable and heat-conducting medium.

Advantageously, the flowable, curable and heat-conducting medium can be applied simultaneously to the carrier substrate face ends, extending perpendicular to the main surfaces of the carrier substrates, in such a way that the flowable, curable medium forms the encompassing wall. This obviates one additional production step for fixation of the wall to the stack.

Advantageously, as the flowable, curable and heat-conducting medium, a capillary flowable adhesive can be used.

In another exemplary embodiment, it is provided that the flowable, curable and heat-conducting medium comprises an injection molding composition. The stack comprising the carrier substrates and the semiconductor components can then be produced for instance by an injection molding process, or by transfer molding.

Advantageously, the terminals of the power semiconductor module are formed by contact elements, which are each electrically contacted to a respective conductor track disposed on a carrier substrate and are extended laterally out of the interstices between the carrier substrates and are extended through the encompassing wall to the outside out of the housing part. If the encompassing wall comprises an electrically conductive material, then insulating leadthroughs for the contact elements can for instance be provided. To achieve a hermetically sealed closure of the housing part, the insulating leadthroughs, for instance in the form of glass leadthroughs, can each be introduced into a respective recess of the encompassing wall.

In another exemplary embodiment, it is provided that the encompassing wall is affixed at least in part to the carrier substrate face ends that extend perpendicular to the main surface of the carrier substrates. For instance, the wall can be produced from a single metal strip, which is glued or soldered or affixed in some other way to the face ends of the carrier substrates.

It is especially advantageous to embody the encompassing wall by means of at least one closed encompassing frame, which is placed between an upper and a lower carrier substrate in such a way that at least the at least one semiconductor component is completely surrounded by the frame, and the frame is tightly joined to the upper carrier substrate and the lower carrier substrate. In this case, one frame is required for each interstice between two carrier substrates.

Preferably, the frames are embodied as metal frames and are soldered over a large surface area to an encompassing conductor track of the upper carrier substrate and to an encompassing conductor track of the lower carrier substrate. The soldering of the frames is advantageously done together with the soldering of the semiconductor components to the conductor tracks of the carrier substrates. The production of a power semiconductor module of this kind can be performed especially simply and reliably. Since the encompassing frames do not allow the terminals to be extended to the outside laterally from the interstice between the carrier substrates, the electrical terminals of the semiconductor components are extended to the outside via via-holes in the carrier substrates and on the outside of the outer carrier substrates are electrically connected to contact elements.

In another advantageous exemplary embodiment of the invention, it is provided that in the stack, at least one carrier substrate is disposed with an elastically resilient layer, and the stack formed is elastically resiliently compressible in a direction perpendicular to the plane of the carrier substrates. This advantageously makes it possible for the power semiconductor module to be inserted into a suitably designed groove or pocket in a cooling body, and by the clamping force of the elastically resilient layer, the outer carrier substrates are pressed firmly against the cooling body. A screw connection is not needed for this purpose. The elastically resilient layer can for instance be fabricated from an elastically deformable plastic. In another exemplary embodiment, it is provided that the elastically resilient layer be embodied by a plurality of spring elements disposed in the same plane.

BRIEF DESCRIPTION OF THE DRAWINGS

Other features and advantages of the invention will be apparent from the detailed description contained herein below, taken with the drawings, in which:

FIG. 3a is a cross section through a third exemplary embodiment of the invention;

FIG. 3b is a section through FIG. 3a taken along the line D—D; and

DESCRIPTION OF THE PREFERRED EMBODIMENTS

Figure 1A:
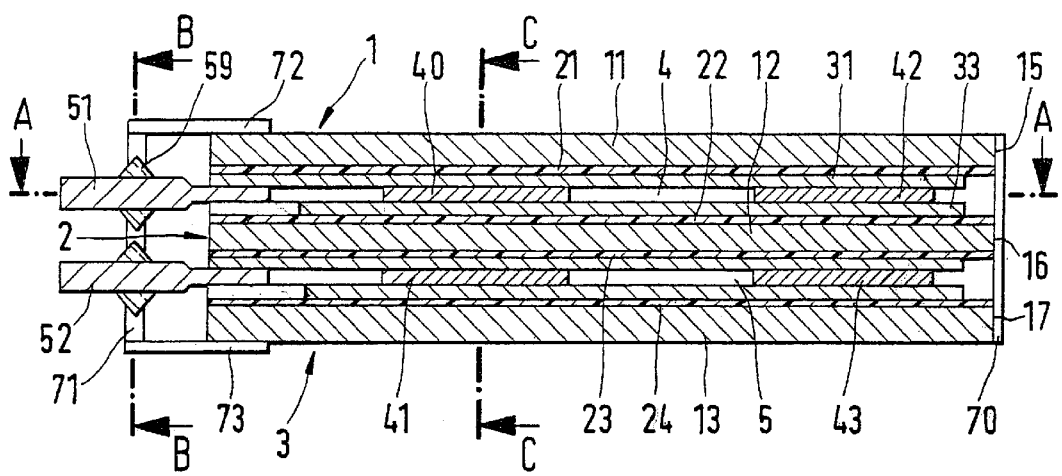
FIG. 1a is a cross section through a first exemplary embodiment of the power semiconductor module of the invention.

As shown in FIG. 1, the power semiconductor module embodying the invention includes a stack of a plurality of carrier substrates 1, 2, 3. In the exemplary embodiments shown here, the power semiconductor module includes a total of three carrier substrates, but it is also possible to use a stack of only two carrier substrates or of more than three carrier substrates. In the example in FIGS. 1a–1d, the carrier substrates 1, 2, 3 are so-called IMS substrates (Insulated Metal Substrates), which each include one metal plate 11, 12, 13. The metal plate is provided, on at least one main surface, with a thin insulating layer 21, 22, 23, 24. A thin metal layer, in which conductor tracks 31–36 are embodied in a known way by structuring, is applied onto each insulating layer. Thus the first carrier substrate 1 includes the conductor tracks 31, 32 on its underside. The carrier substrate 2 has one conductor track 33 on its top and two conductor tracks 34 and 35 on its bottom. The third carrier substrate has one conductor track 36 on its top. As shown in FIG. 1a, semiconductor components 40–43 are disposed in the two interstices 4, 5 between the three carrier substrates 1, 2, 3. As can be seen from FIG. 1a and FIG. 1c, the semiconductor components 41 and 43 are soldered by their underside onto the conductor track 36 of the third carrier substrate 3 and are thereby electrically contacted to the conductor track 36. The second carrier substrate 2 is soldered with the lower conductor tracks 34 and 35 to the top side of the semiconductor components 41, 43. The conductor track 34 is electrically connected to a first terminal, not shown, and the second conductor track 35 to a second terminal of the semiconductor components 41, 43. Two further semiconductor components 40, 42 are soldered onto the upper conductor track 33 of the middle, second carrier substrate. The stack is closed off by a first carrier substrate 1, which is soldered with conductor tracks 31, 32 onto the semiconductor components 40, 42. By way of example, the semiconductor components 40–43 are power transistors.

The stack construction is not limited to the exemplary embodiment shown, however. For instance, further semiconductor components and other electronic circuit elements could be provided in each interstice 4, 5 of the stack construction. The semiconductor components can also be connected to the conductor tracks 31–36 via an electrically conductive glue. However, soldering the semiconductor components is preferred, since by way of the soldered connections an especially rapid dissipation of the heat generated by the semiconductor components is effected to the outer carrier substrates 1 and 3. It is also naturally possible to stack more than three carrier substrates one above the other in the manner shown, or to use only two carrier substrates. Optionally, via-holes can be introduced into the carrier substrates, in order to connect the various conductor track planes with one another or to improve the heat dissipation in a direction perpendicular to the carrier substrates. The choice of carrier substrates is not limited to IMS substrates. For instance, DCB (Direct Copper Bonded) substrates with a ceramic core, or other suitable substrates, could also be employed.

Figure 1B:
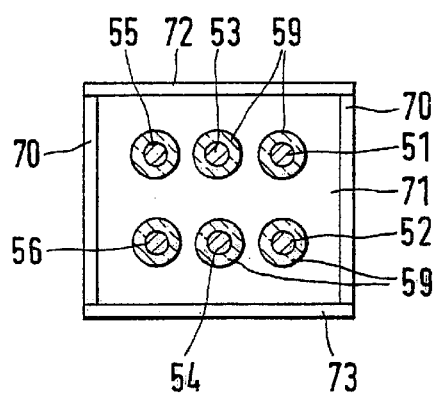
FIG. 1b is a section through FIG. 1a taken along the line B—B.
Figure 1C:
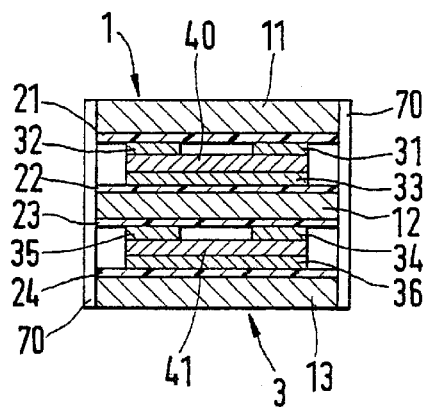
FIG. 1c is a section through FIG. 1a taken along the line C—C.
Figure 1D:
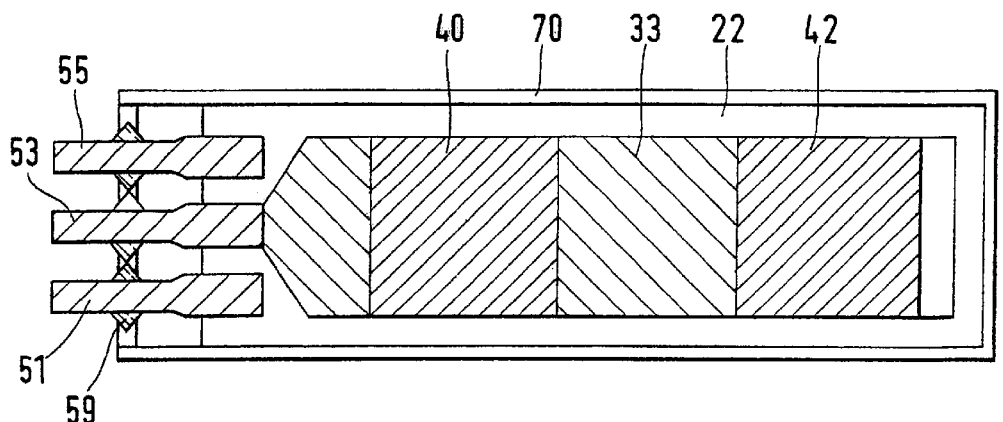
FIG. 1d is a section through FIG. 1a taken along the line A—A.

As can be seen in FIG. 1a and FIG. 1c, the upper carrier substrate 1 and the lower carrier substrate 3 of the essentially block-shaped stack form an upper and lower housing wall, respectively, of the power semiconductor module. The four side walls of the housing part are formed by an encompassing wall 70, which is affixed to the face ends 15, 16, 17 of the carrier substrates that extend perpendicular to the main surfaces of the carrier substrates 1, 2, 3. The wall 70 can be embodied as a metal foil and is secured to the face ends of the carrier substrates by soldering or gluing, for instance, or in some other way. As shown in FIGS. 1b and 1d, six contact elements 51–56 are each contacted to a respective one of the conductor tracks 31–36. For this purpose, the ends of the contact elements toward the power semiconductor module are soldered, or contacted in some other way, to the associated conductor tracks in the interstices 4, 5 of the carrier substrates. As seen from FIG. 1d, the contact element 53 is electrically connected for instance to the conductor track 33. The contact elements 51, 55 are soldered to the upper conductor tracks 31 and 32, which are not visible in FIG. 1d. This can be done together with the soldering of the semiconductor components.

As is also shown, the ends of the contact elements 51–56 remote from the power semiconductor module are extended out of the housing part through the wall 70. Glass leadthroughs 59, which are provided in openings in the end wall 71 of the wall 70 and which concentrically surround the contact elements, serve to insulate the contact elements from the metal wall 70. The wall 70 can be embodied in one piece or in multiple parts. For instance, the end wall 71 can be produced separately along with the glass leadthroughs and joined to a metal foil wound in a U around the carrier substrates, as can be seen best from FIG. 1d. If the end wall 71 is spaced apart somewhat from the stack of carrier substrates, as shown in FIG. 1a, covers 72, 73 that are joined to the upper and lower housing walls on the one hand and to the end wall 71 on the other serve to seal off the housing part. Given a suitable embodiment of the contact elements 51–56, however, the end wall 71 can also be placed directly on one face end of the carrier substrates. The possible spacing between the end wall 71 and the carrier substrates and the interstices 4, 5 between the carrier substrates can be filled with a flowable, curable and heat-conducting medium, such as a capillary adhesive, which is known in the field of flip-chip technology, for instance, as underfill. By means of the flowable, curable and heat-conducting medium, the heat dissipation to the outer carrier substrates 1, 3 is improved and furthermore the tightness of the housing formed is enhanced. The housing part is preferably hermetically tightly sealed by the fixation of the wall 70 to the end walls 15, 16, 17.

Figure 2A:
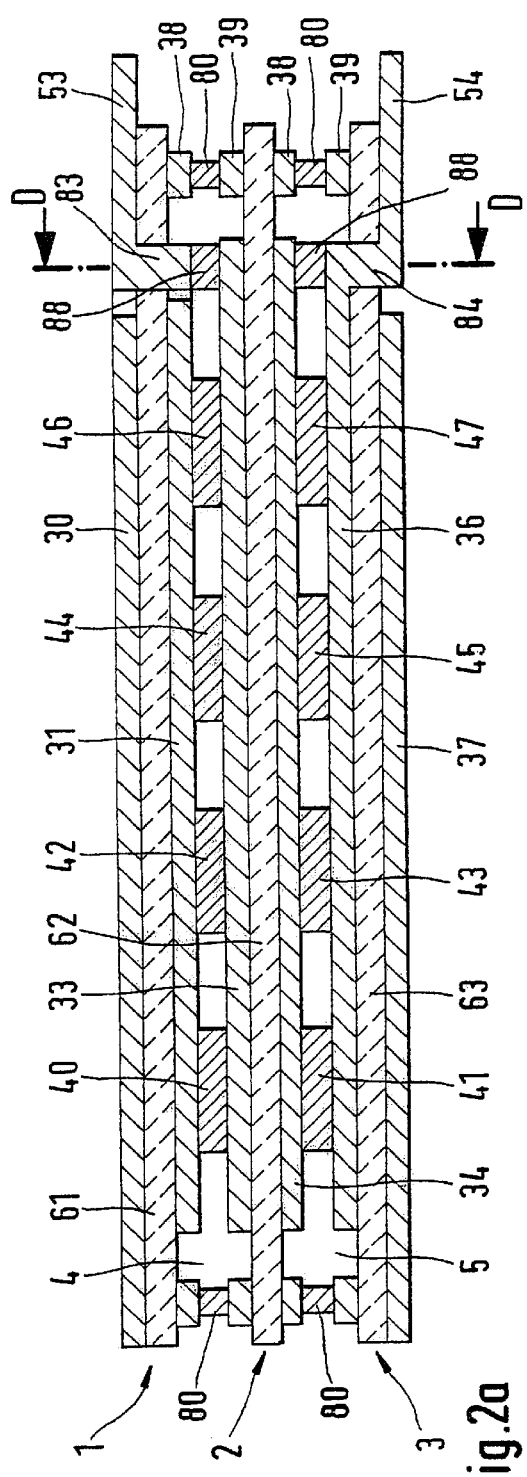
FIG. 2a is a cross section through a second exemplary embodiment of the invention.
Figure 2B:
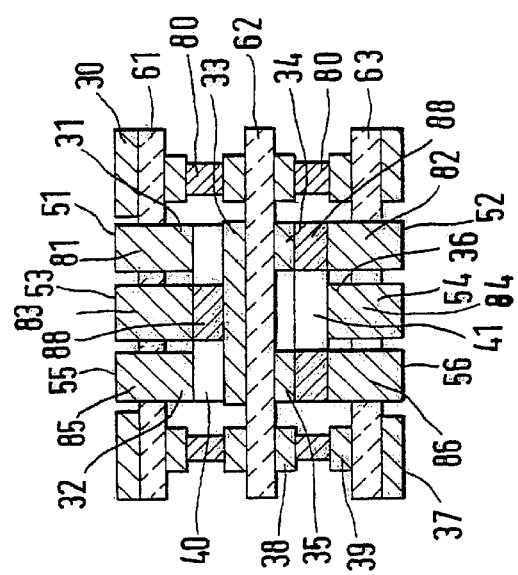
FIG. 2b is a section through FIG. 2a taken along the line D—D.

A further exemplary embodiment of the invention is shown in FIGS. 2a and 2b. The three carrier substrates 1, 2, 3 in this example comprise DCB substrates, which each have a respective ceramic plate 61, 62, 63 of $Al_2O_3$ or AlN, for instance, to whose top and bottom a layer of copper has been applied. Conductor tracks 30–37 are structured in the copper layers; the conductor tracks 31–36 are equivalent to the conductor tracks shown in FIGS. 1a and 1c. In the interstices 4, 5 between the carrier substrates 1, 2, 3, semiconductor components 40–47 are disposed, which as described in the first exemplary embodiment are soldered to the conductor tracks 31–36. Unlike the exemplary embodiment of FIGS. 1a–1d, here the encompassing wall is formed by two encompassing, rectangular frames 80, with one closed frame, surrounding the semiconductor components accommodated there, disposed in each interstice 4, 5. The frames 80 are preferably metal frames, which are soldered to encompassing conductor tracks 38, 39 of the carrier substrates. As shown, the upper frame 80, for instance, is soldered to a closed conductor track 39 on the carrier substrate 2 and to a closed conductor track 38 of the carrier substrate 1; all of the semiconductor components 40, 42, 44, 46 are disposed inside the closed conductor tracks 38, 39 between the carrier substrates 1, 2. The electrical terminals of the power semiconductor module, unlike FIG. 1, are not extended out of the stack at the sides but instead are connected via via-holes 81–86 to contact elements 51–56 on the outsides of the outer carrier substrates 1, 3. The contact elements 51–56 are formed by structuring from the outer conductor tracks 30 and 37 of the stack and are optionally reinforced with metal foils. The ends of the contact elements 51–56 remote from the power semiconductor module preferably protrude in the form of connection lugs from the power semiconductor module. As shown in FIGS. 2a and 2b, to that end the conductor tracks 31 and 32 connected to the upper terminals of the semiconductor components 40, 42, 44, 46 can be extended to the outside directly via via-holes 81 and 85, while the conductor track 33 connected to the lower terminal surface of the semiconductor components 40, 42, 44, 46 is soldered to the via-hole 83 via a contact piece 88. The soldering of the contact piece 88 can be done together with the soldering of the semiconductor components 40, 42, 44, 46, and the height of the contact piece is approximately equivalent to the height of the semiconductor components. The same is true for the conductor tracks 34–36 and for the lower semiconductor components 41, 43, 45, 47 and lower contact pieces 88.

In FIGS. 3a and 3b, a third exemplary embodiment is shown, which differs from the example shown in FIGS. 2a and 2b only in that the middle carrier substrate 2 is constructed differently here. As can be seen, the carrier substrate 2 includes a central layer 90, which is embodied as elastically resilient. For example, the layer 90 comprises an elastically deformable plastic or a plurality of spring elements disposed in the same plane. A ceramic layer 62a and 62b is disposed on the top and bottom, respectively, of the elastically deformable layer 90. A conductor track 33 and 34 is applied to the side, remote from the elastic layer 90, of the respective ceramic 62a and 62b. Otherwise, the construction of the power semiconductor module is done in the same way as in the example shown in FIG. 2a. However, it is also conceivable to apply the conductor tracks 33 and 34 directly to the elastic layer 90 and to omit the ceramic layers 62a and 62b, if the elastic layer 90 comprises an elastically insulating material, such as a plastic.

Because of the elastically resilient layer 90, the stack of carrier substrates is compressible perpendicular to the main surface of the carrier substrates. Despite the deformability of the stack, however, the housing of the power semiconductor module is always tightly sealed, since the two frames 80 move relative to one another in the event of any compression. The power semiconductor module shown can for instance be inserted by being pressed together into the groovelike recess of a cooling body 95. By the clamping force of the elastically resilient layer, the outer carrier substrates 1 and 3 are firmly pressed with the outer conductor tracks 30 and 37 against the cooling body, and the heat output is thus improved. For this purpose, there is no need to screw the power semiconductor module to the cooling body.

Figure 4:
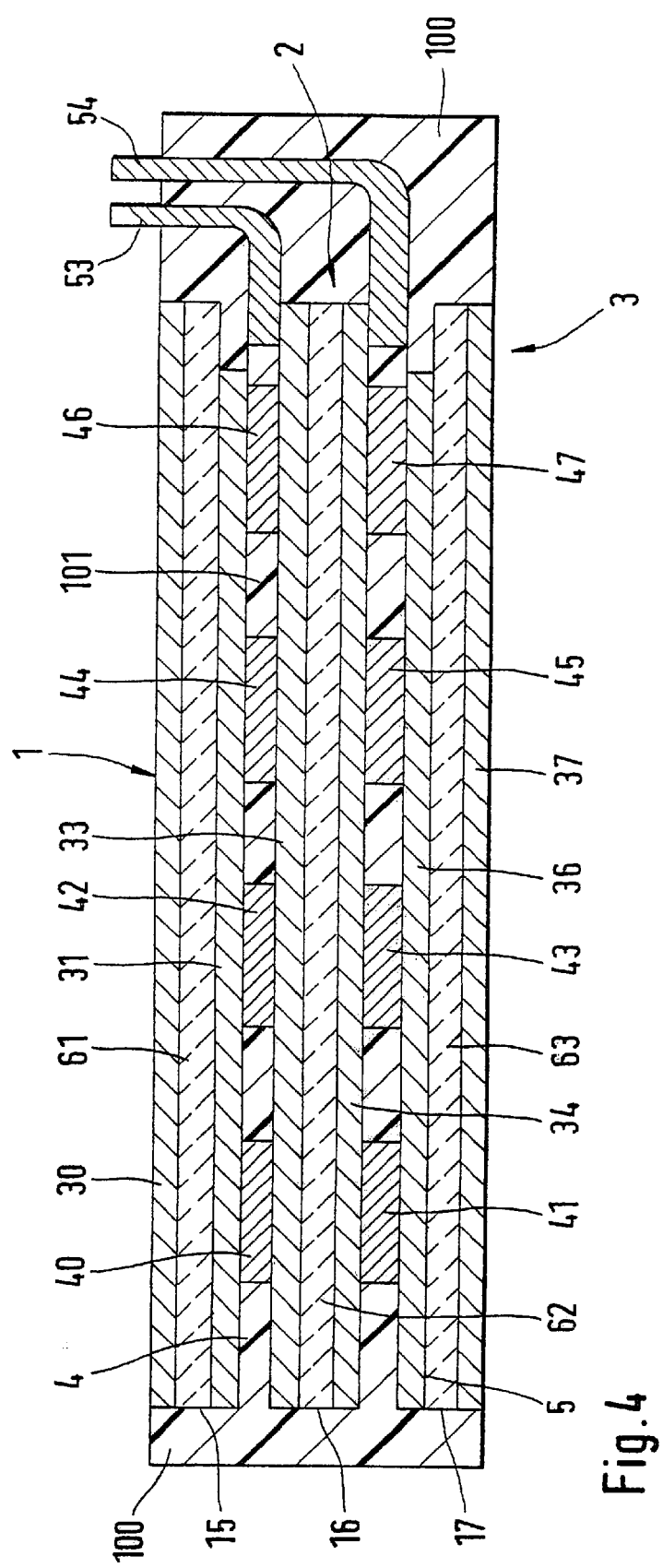
FIG. 4 is a cross section through a fourth exemplary embodiment of the invention.

FIG. 4 shows a fourth exemplary embodiment of the invention. Once again, the carrier substrates 1, 2, 3 are DCB substrates with a central ceramic plate 61, 62, 63. Unlike the exemplary embodiments shown in FIGS. 1–3, the encompassing wall is not formed by a coiled wall secured to the carrier substrates or by a plurality of stacked encompassing frames but rather by injection molding composition 101, which in a suitably designed injection tool is injected in such a way into the interstices 4, 5 between the carrier substrates 1, 2, 3 and onto the face ends 15, 16, 17 of the carrier substrates that after unmolding from the tool, an encompassing wall 100 of injection molding composition remains on the face ends 15–17, and this wall hermetically tightly encapsulates the power semiconductor module in hermetically sealed fashion. The terminals 51–56 of the power semiconductor module are formed by contact elements, which are soldered to the conductor tracks 31–36 similarly to FIG. 1. The contact elements can advantageously be bent into a desired shape before being spray-coated.

For cooling, the power semiconductor module shown in FIGS. 1–4 can be placed in a flowing coolant fluid or into the air flow of a cooling assembly. The outer carrier substrates 1, 3 are then cooled directly by a coolant that bathes the housing part.

The foregoing relates to preferred exemplary embodiments of the invention, it being understood that other variants and embodiments thereof are possible within the spirit and scope of the invention, the latter being defined by the appended claims.

What is claimed is:

1. In a power semiconductor module, including a stack of carrier substrates (1, 2, 3), disposed one above the other in multiple layers, which are provided on at least one main surface with at least one conductor track (31–36), at least one electronic semiconductor component (40–47) being disposed between two adjacent carrier substrates of the stack and being contacted electrically and heat-conductively to at least one conductor track (31–36) of a carrier substrate disposed in the stack above the semiconductor component and to at least one further conductor track (31–36) of a carrier substrate disposed in the stack below the semiconductor component, the improvement wherein the two outer carrier substrates (1, 3) of the stack form one upper and one lower housing wall of a closed housing part surrounding the at least one semiconductor component (40–47), the heat generated by the semiconductor component being dissipated at least in part to the upper and lower housing walls formed by the outer carrier substrates (1, 3) and from there being radiated to the surroundings of the housing part; and that the interstices (4, 5) between the stacked carrier substrates are tightly closed by an encompassing wall (70, 80, 100) secured to the carrier substrates.

2. The power semiconductor module of claim 1, wherein the housing part formed by the upper and lower housing wall (1, 3) and the encompassing wall (70, 80, 100) is a hermetically sealed housing part.

3. The power semiconductor module of claim 1, wherein the electrically contacting of the at least one semiconductor component (40–47) to the at least one conductor track (31–36) of the carrier substrate disposed above the semiconductor component and to the at least one further conductor track (31–36) of the carrier substrate disposed below the semiconductor component is effected by soldering.

4. The power semiconductor module of claim 1, wherein the interstices (4, 5) between the stacked carrier substrates (1, 2, 3) are completely filled by a flowable, curable and heat-conducting medium (101).

5. The power semiconductor module of claim 4, wherein the flowable, curable and heat-conducting medium is applied to the carrier substrate face ends (15, 16, 17) extending perpendicular to the main surfaces of the carrier substrates (1–3) in such a way that the flowable, curable medium (101) simultaneously forms the encompassing wall (100).

6. The power semiconductor module of claim 4, wherein the flowable, curable and heat-conducting medium (101) is a capillary flowable adhesive.

7. The power semiconductor module of claim 4, wherein the flowable, curable and heat-conducting medium (101) is an injection molding composition.

8. The power semiconductor module of claim 1, wherein contact elements (51–56) are provided, which are each electrically contacted to a respective conductor track (31–36) disposed on a carrier substrate (1–3) and are extended laterally out of the interstices (4, 5) between the carrier substrates (1–3) and are extended through the encompassing wall (70, 100) to the outside out of the housing part.

9. The power semiconductor module of claim 8, wherein insulating leadthroughs (59) for the contact elements (51–56) are provided in the encompassing wall (70).

10. The power semiconductor module of claim 9, wherein the insulating leadthroughs (59) are glass leadthroughs, which are each introduced into a recess of the encompassing wall (70) and surround one contact element (51–56) in hermetically sealed fashion.

11. The power semiconductor module of claim 10, wherein the encompassing wall (70) is affixed at least in part to the carrier substrate face ends (15, 16, 17) extending perpendicular to the main surface of the carrier substrates (1–3).

12. The power semiconductor module of claim 1, wherein the encompassing wall is formed by at least one closed encompassing frame (80), which is placed between an upper and a lower carrier substrate (1, 2, 3) in such a way that at least the at least one semiconductor component (40–47) is completely surrounded by the frame (80), and the frame is tightly joined to the upper carrier substrate and the lower carrier substrate.

13. The power semiconductor module of claim 12, wherein the frame (80) is a metal frame and is soldered over a large surface area to an encompassing conductor track (38) of the upper carrier substrate and to an encompassing conductor track (39) of the lower carrier substrate.

14. The power semiconductor module of claim 12, wherein the electrical terminals of the semiconductor components (40–47) are extended to the outside via via-holes (81–86) in the carrier substrates (1, 2, 3) and on the outside of the outer carrier substrates (1, 3) are electrically connected to contact elements (51–56).

15. The power semiconductor module of claim 12, wherein in the stack, at least one carrier substrate (2) is disposed with an elastically resilient layer (90) in such a way that the stack formed is elastically resiliently compressible in a direction perpendicular to the plane of the carrier substrates (1, 2, 3).

16. The power semiconductor module of claim 15, wherein the elastically resilient layer (90) is fabricated from an elastically deformable plastic.

17. The power semiconductor module of claim 15, wherein the elastically resilient layer (90) is formed by a plurality of spring elements disposed in the same plane.

18. The power semiconductor module of claim 5, wherein the flowable, curable and heat-conducting medium (101) is a capillary flowable adhesive.

19. The power semiconductor module of claim 5, wherein the flowable, curable and heat-conducting medium (101) is an injection molding composition.

20. The power semiconductor module of claim 13, wherein the electrical terminals of the semiconductor components (40–47) are extended to the outside via via-holes (81–86) in the carrier substrates (1, 2, 3) and on the outside of the outer carrier substrates (1, 3) are electrically connected to contact elements (51–56).

21. The power semiconductor module of claim 13, wherein in the stack, at least one carrier substrate (2) is disposed with an elastically resilient layer (90) in such a way that the stack formed is elastically resiliently compressible in a direction perpendicular to the plane of the carrier substrates (1, 2, 3).

22. The power semiconductor module of claim 14, wherein in the stack, at least one carrier substrate (2) is disposed with an elastically resilient layer (90) in such a way that the stack formed is elastically resiliently compressible in a direction perpendicular to the plane of the carrier substrates (1, 2, 3).

23. The power semiconductor module of claim 20, wherein in the stack, at least one carrier substrate (2) is disposed with an elastically resilient layer (90) in such a way that the stack formed is elastically resiliently compressible in a direction perpendicular to the plane of the carrier substrates (1, 2, 3).

24. The power semiconductor module of claim 21, wherein the elastically resilient layer (90) is fabricated from an elastically deformable plastic.

25. The power semiconductor module of claim 22, wherein the elastically resilient layer (90) is fabricated from an elastically deformable plastic.

26. The power semiconductor module of claim 23, wherein the elastically resilient layer (90) is fabricated from an elastically deformable plastic.

27. The power semiconductor module of claim 21, wherein the elastically resilient layer (90) is formed by a plurality of spring elements disposed in the same plane.

28. The power semiconductor module of claim 22, wherein the elastically resilient layer (90) is formed by a plurality of spring elements disposed in the same plane.

29. The power semiconductor module of claim 23, wherein the elastically resilient layer (90) is formed by a plurality of spring elements disposed in the same plane.

* * * * *